United States Patent [19]
Schneider

[11] Patent Number: 5,889,485
[45] Date of Patent: Mar. 30, 1999

[54] CHARGE-SUMMING DIGITAL-TO-ANALOG CONVERTER

[75] Inventor: Edmund Mark Schneider, Essex Junction, Vt.

[73] Assignee: International Business Machines Corporation, Armonk, N.Y.

[21] Appl. No.: 922,791

[22] Filed: Sep. 2, 1997

[51] Int. Cl.[6] .................................................. H03M 1/82
[52] U.S. Cl. .......................................... 341/150; 341/144
[58] Field of Search .................................. 341/172, 120, 341/118, 144, 150, 155, 154

[56] References Cited

U.S. PATENT DOCUMENTS 5,400,028  3/1995  Schlig ...................................... 341/150
5,684,487  11/1997  Timko ..................................... 341/172

Primary Examiner—Brian Young
Attorney, Agent, or Firm—Schmeiser, Olsen & Watts; Robert A. Walsh

[57] ABSTRACT

An integrated circuit includes a digital bus providing a first portion of less significant signals, and a second portion of more significant signals. A digital-to-charge converter connected to the digital bus includes circuitry to convert the less significant portion of the signals to a first charge, and to convert the more significant portion of the signals to a second charge. A charge-to-voltage converter connected to the digital-to-charge converter includes circuitry to convert the first charge to an intermediate voltage. A voltage-to-charge converter connected to the charge-to-voltage converter converts the intermediate voltage to a third charge. A charge-summer connected to the digital-to-charge converter and the voltage-to-charge converter combines the second charge with the third charge to produce a combined charge. The charge-to-voltage converter also is connected to the charge-summer to convert the combined charge to an analog output voltage.

16 Claims, 11 Drawing Sheets

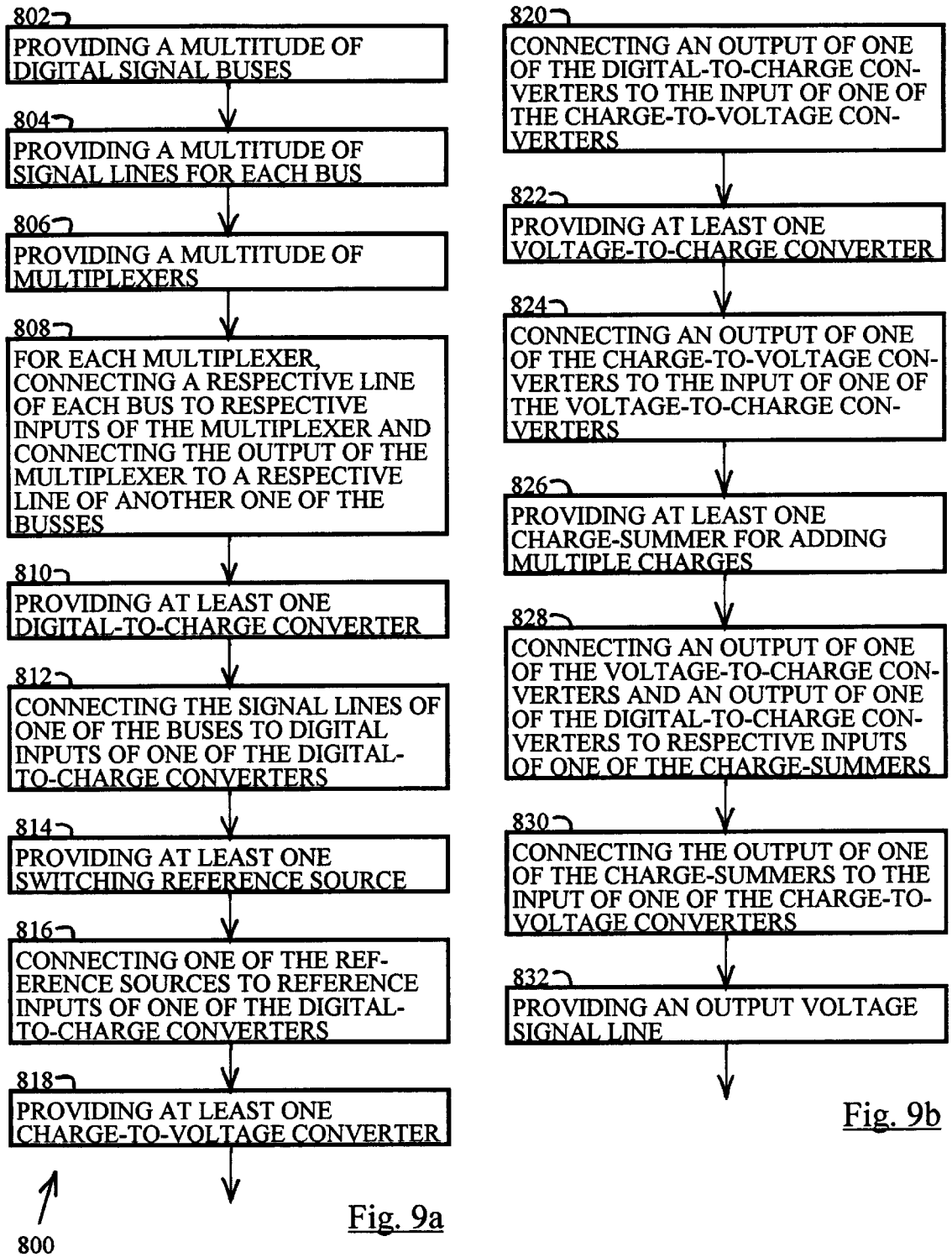

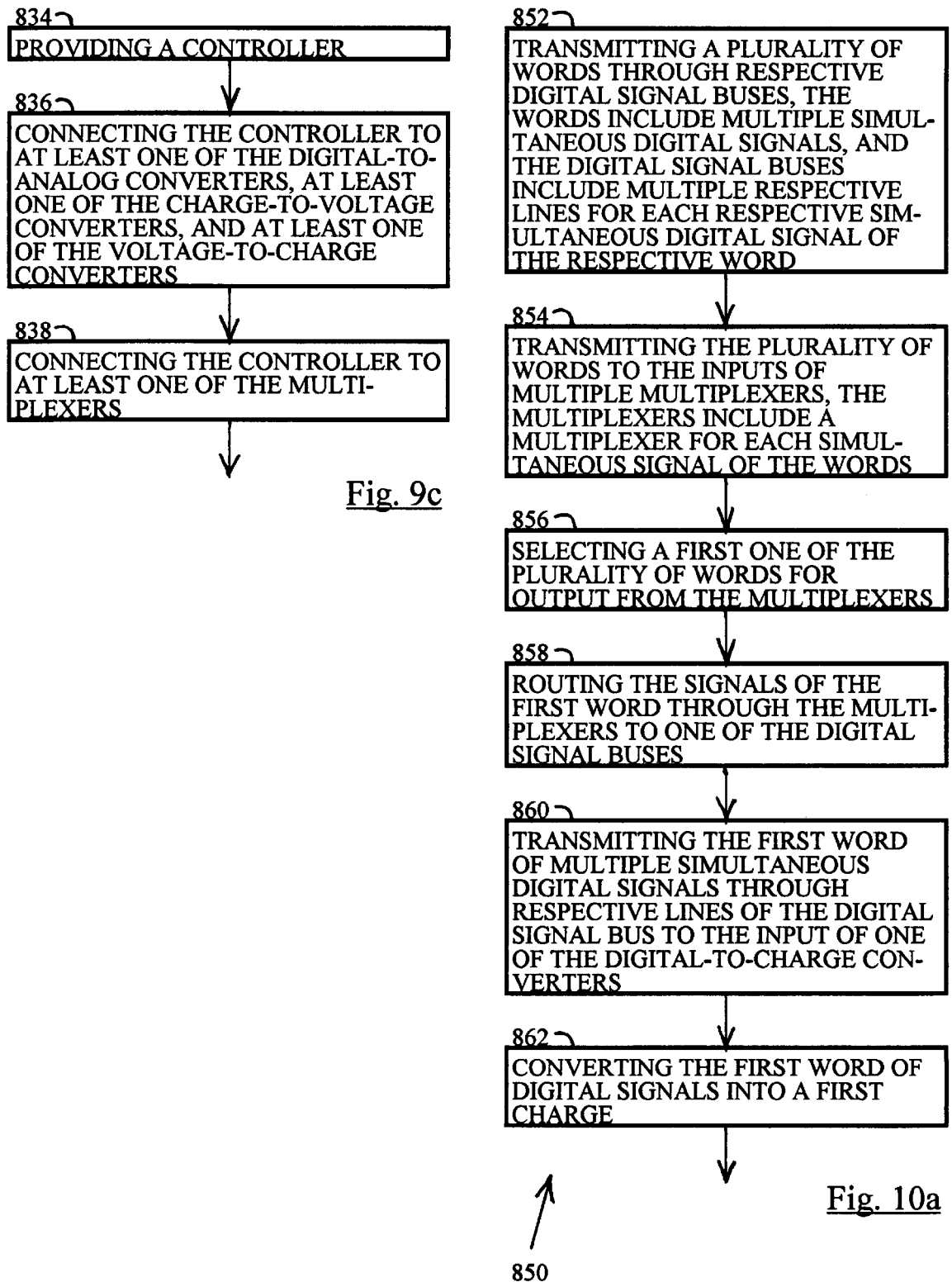

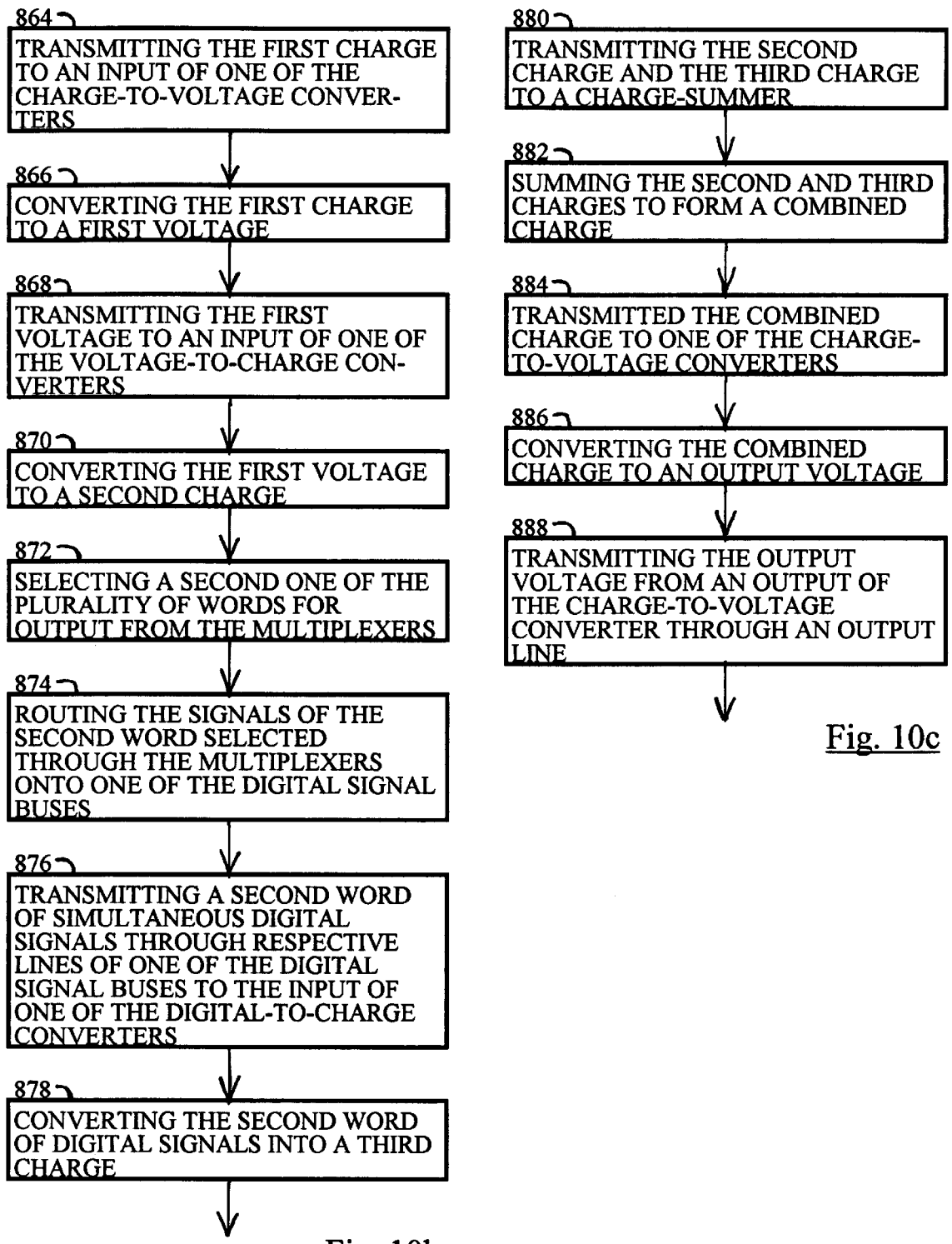

CHARGE-SUMMING DIGITAL-TO-ANALOG CONVERTER

FIELD OF INVENTION

This invention relates to information handling systems, and more specifically to the conversion between digital signals and analog signals in such systems. This invention most closely relates to the field of integrated-circuit, digital-to-analog converters.

BACKGROUND OF THE INVENTION

Digital systems often require digital-to-analog (D/A) converters and analog-to-digital (A/D) converters to communicate with analog components. For example, the speed of a DC motor may be controlled by an analog voltage level or current. Previous patents related to D/A converters include U.S. Pat. Nos. 3,967,272 to Sandford, Jr.; 4,410,879 to Gumm; 4,584,568 to Zomorrodi; 4,616,212 to Law; 4,618,852 to Kelley; 4,665,380 to ; 4,667,179 to Law; 4,973,979 to Ikeda; 4,998,108 to Ginthner; and 5,489,904 to Hadidi. Articles related to D/A converters include "All-MOS charge Redistribution Analog-to-Digital Conversion Techniques— Part 1" by McCreary, James L. and Gray, Paul R. in *IEEE Journal of Solid State Circuits*, vol. Sc-10, pp. 371–79, Dec 1975; and "Integrated PCM Codec" by Ohri, Kul B. and Callahan, Michael J. in *IEEE Journal of Solid-State Circuits*, vol. SC-14, pp. 36–46, Feb. 1979. The above citations are all incorporated herein in whole by reference.

Herein, voltage is abbreviated V, charge is abbreviated Q, current is abbreviated C, digital is abbreviated D, and analog is abbreviated A. Other abbreviations will be introduced below in the description to reduce unnecessary repetition.

SUMMARY OF THE INVENTION

The present invention provides an improved digital to analog converter by providing a system that outputs an analog signal based on an inputted digital signal having n bits. The system comprises (1) a multiplexor device for receiving the n bits and sequentially outputting a first subset of said n bits (e.g., the least significant n/2 bits) and then outputting a second subset of said n bits (e.g., the most significant n/2 bits); (2) a digital to analog converter that, in sequence, converts the first subset of the n bits from the multiplexor into a first analog signal, and then converts the second subset of the n bits from said multiplexor into a second analog signal; (3) a scaling mechanism that scales the first analog signal; and (4) a summing mechanism that sums the scaled first analog signal and the second analog signal and outputs an analog signal.

In one aspect of these inventions, an integrated circuit (IC) includes a bus for parallel, digital signals. If serial digital signals are provided, they will be converted to parallel digital signals. The parallel bus includes lines for a more significant portion (MSP) of the digital signals, and for a less significant portion (LSP) of the digital signals. The IC also includes a digital-to-charge converter (D-Q). The lines of the bus are connected to a digital signal input of the D-Q. The converter includes circuitry to convert the LSP of the signals to a first charge (Q1), and to convert the MSP of the signals to a second charge (Q2). The IC also includes a charge-to-voltage converter (Q-V). An output of the D-Q communicates with an input of the Q-V to transfer the Q1 to the Q-V. The Q-V includes circuitry to convert the Q1 to an intermediate voltage (V1).

The IC also includes a voltage-to-charge converter (V-Q). An output of the Q-V communicates with an input of the V-Q to transfer the voltage, V1. The V-Q includes circuitry to convert V1 to a third charge (Q3). The Q3 produced by the V-Q, is scaled or weighted with respect to the Q2 depending on the number of signal bits of the MSP, so that the sum of the Q2 and Q3 will be proportional to the binary value represented by the digital signals of the MSP and LSP.

The IC also includes a charge-summer (ΣQ). The output of the V-Q communicates with an input of the ΣQ to transfer the Q3 to the ΣQ. An output of the D-Q also communicates with the ΣQ to transfer the Q2 to the ΣQ. The ΣQ includes a circuit to combine the Q2 and Q3 to produce a combined charge (QC). The ΣQ communicates with the Q-V to transfer the QC to the Q-V. The Q-V further includes means to convert the QC to an analog output voltage (VO).

The IC also includes control circuitry to regulate the operation of the D-Q, Q-V and V-Q.

The circuitry of the above invention provides highly accurate, high-speed conversion of digital signals to an analog voltage with minimal complexity and is very efficient in terms of IC area. If digital signals are in serial form then they can be easily converted to parallel form using methods well-known in the art. The unit is easily expandable, as described in detail below, either by additional time-multiplexing or by adding sections in a cascade formation or by adding sections in a parallel arrangement.

The inventions herein also include non-obvious combinations of the above circuitry with additional circuitry, or selection of specific types of circuitry that have special advantages. The inventions include providing a digital multiplexer which communicates with the digital signal bus. The output of the multiplexer communicates with the parallel input of the D-Q. The controller sequentially selects portions of the digital signals from the digital bus, and routes the selected digital signals via the multiplexer to the D-Q.

The D-Q converts its input digital signals to analog charges which can be scaled, stored, and later recombined with subsequent D-Q outputs to provide an analog representation for value of the input digital signals.

The inventions include providing a D-Q which operates by charge redistribution and which includes a charge redistribution line, and a first reference voltage (Vr1) connected to the charge redistribution line through a first charging switch. The charge redistribution converter also includes a plurality of binaurally weighted conversion capacitors, including a first conversion capacitor with a minimum size (often referred to as a unit size) to provide a desired resolution with respect to noise and manufacturability. The term "binaurally weighted capacitors" means a number of capacitors in which the area or capacitance of each subsequent capacitor is double the area or capacitance of the previous capacitor. The first plate of each conversion capacitor is connected to the charge redistribution line through a respective charge isolation switch. The second plate of each respective conversion capacitor communicates through a second charging switch with a second reference voltage (Vr2). Each respective line of the digital signals presented to the input of the D-Q, controls the charge isolation switch in the path between the respective binaurally weighted capacitor and the charge distribution line to control the charging and discharging of the conversion capacitor. The output of the D-Q is received by the Q-V through a redistribution switch.

The inventions include provision for a bipolar type converter D-Q in which the source of a Vr1 and source of a Vr2 are selected depending on the sign bit of the digital word. Each reference voltage value Vr1 and Vr2 can be An selected from a source of high voltage and a source of low voltage depending on the sign bit of the input digital word. The SIGN BIT signal controls the output selection between a first state (in which the Vr1 is connected with the source of high voltage and the Vr2 is connected with the source of low voltage) and a second state (in which the Vr1 is connected with the source of low voltage and the Vr2 is connected with the source of high voltage).

The inventions include providing the bipolar D-Q with a sign capacitor of the minimum (i.e. unit) size. One plate of the sign capacitor is connected with the charge redistribution line through a switch controlled by the sign bit to allow the D-Q to add a least significant bit's (LSB's) value to the charge of the D-Q's output depending on the sign bit.

For a time multiplexed embodiment, the sign capacitor is connected through two switches to the charge distribution line. The second switch closes and hence allows the sign capacitor to affect the D-Q's output only when the charge for the LSP is being redistributed.

The inventions include providing a Q-V made up of an amplifier (preferably an operational amplifier), an integration capacitor, and a switch to discharge the integration capacitor. The inputs of the amplifier are charge redistribution line and the common-mode line. The value of the capacitor is equal to the additive capacitance of all the conversion capacitors in the D-Q. The control circuit controls the switch and when the switch is closed, shorts the plates of the integration capacitor, discharging the capacitor.

The inventions further include, in a time multiplexed configuration, providing a V-Q made up of: an input switch, an output switch, and a sampling capacitor connected to the ΣQ through the output switch. The input switch connects the sample capacitor to the output of the Q-V to charge the sampling capacitor and to isolate the sampling capacitor from the voltage output VO. The output switch is controlled by circuitry which includes circuits for connecting the sampling capacitor of the V-Q to the input of the Q-V when the D-Q is outputting the charge for another (more significant) portion of the signals, and for otherwise isolating the sampling capacitor from the input of the Q-V.

The inventions further include, in a configuration with multiple D-Qs, providing a V-Q which is made up of: a first dividing capacitor with a first plate connected with the Q-V through an input switch, and a second dividing capacitor with a first plate connected with ΣQ through an output switch. The first plates of the dividing capacitors are also connected together through a transfer switch. In addition the second plates of the dividing capacitors are connected together to a common point. The input switch connects the first dividing capacitor to the output of the Q-V, to charge the first dividing capacitor and to isolate the sampling capacitor from the Q-V. Control of the output switch is driven by the controller which includes circuitry for synchronization and connecting the second dividing capacitor to the input of ΣQ, when the D-Q is outputting the charge for the more significant portion of the signals, and for otherwise isolating the second dividing capacitor from the input of the ΣQ. The transfer switch is also synchronized and controlled by the controller.

The inventions include, using a simple electrical junction for the ΣQ. The electrical junction is the connection between the output of the D-Q, the input of the Q-V, and the output of the V-Q.

Another aspect of the inventions include a process for operating an IC component. The process includes the steps of converting digital signals of a less significant portion of the signals to a Q1; converting the Q1 to a first analog voltage (V1); and converting the V1 to a Q2. At the same time or immediately thereafter, the inventions further include the steps of converting the digital bit signals of a more significant portion of the signals to a Q3; combining Q2 with Q3 to form a combined analog charge, QC; converting QC to a second analog voltage; and finally transmitting the second analog voltage.

The inventions of applicants include the combination of the preceding fundamental steps with additional steps or more specific steps which provide various advantages. The inventions include converting portions of the signals to analog charges by: charging a plurality of conversion capacitors to provide respective binaurally weighted charges; controlling the setting of a respective switch for each conversion capacitor depending on the value of the respective portion of the digital signals; and redistributing the charges of the capacitors in a charge output line, depending on the setting of the transistor switches. This allows a simple manufacturable circuit to provide a highly accurate proportional charge for each respective portion of the digital signals.

The inventions also include the combination of the above fundamental steps with the step of, switching a reference voltage for charging the capacitors depending on the value of a SIGN BIT signal. This provides a simple mechanism for providing a bipolar output.

The inventions also include the combination of the above fundamental steps with the step of switching a multiplexer to select the less significant portion of the digital signals prior to the step of converting the less significant portion of the signals to Q1, and then switching the multiplexer to select the more significant portion of the signals, prior to converting the more significant portion of the signals to Q3. This allows a single D-Q to convert the charge for two or more portions of the digital signals and minimize area required for converting the digital signals to analog charges.

Another aspect of the invention, is a process for producing an IC component with the circuitry described above.

Other alternatives and advantages of applicant's inventions will be disclosed or become obvious to those skilled in the art by studying the following detailed description with reference to the following drawings which illustrate all the elements of the claimed inventions.

BRIEF DESCRIPTION OF THE DRAWINGS

FIGS. 9a–9c are flow diagrams of the process of the invention for providing the D/A converter of the invention.

FIGS. 10a–10c are flow diagrams of the process of the invention for converting parallel digital signals to an analog voltage.

DETAILED DESCRIPTION OF THE DRAWINGS

For convenience in this detailed description, LSP will be used for the least significant portion and MSP will be used for the most significant portion of the digital signals.

Figure 11:
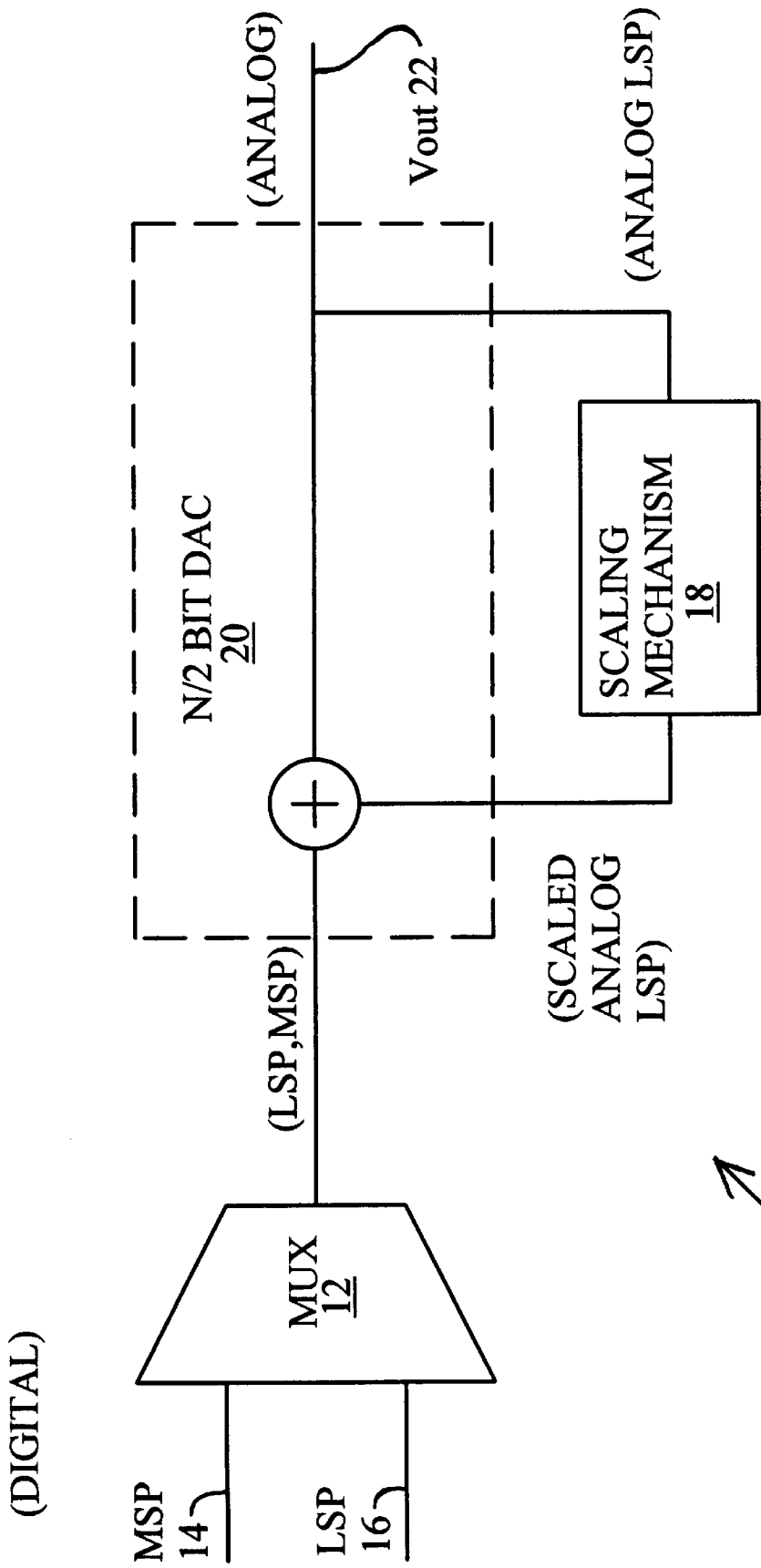
FIG. 11 is a basic block diagram depicting a preferred embodiment of the present invention.

Referring first to FIG. 11, a basic block diagram of the invention is shown. The multiplexor 12 receives an n-bit digital signal and divides it into a most significant portion 14 and a least significant portion 16, each comprised of n/2 bits. The multiplexor 12 then outputs, in sequence the LSP and then the MSP. First, the LSP is converted into an analog signal (by N/2-bit DAC 20) and then scaled by scaling mechanism 18, to create a scaled analog LSP. Then, the MSP is converted into an analog signal (by N/2-bit DAC 20) and is summed with the scaled analog LSP to create an analog output signal Vout 20.

Figure 1:
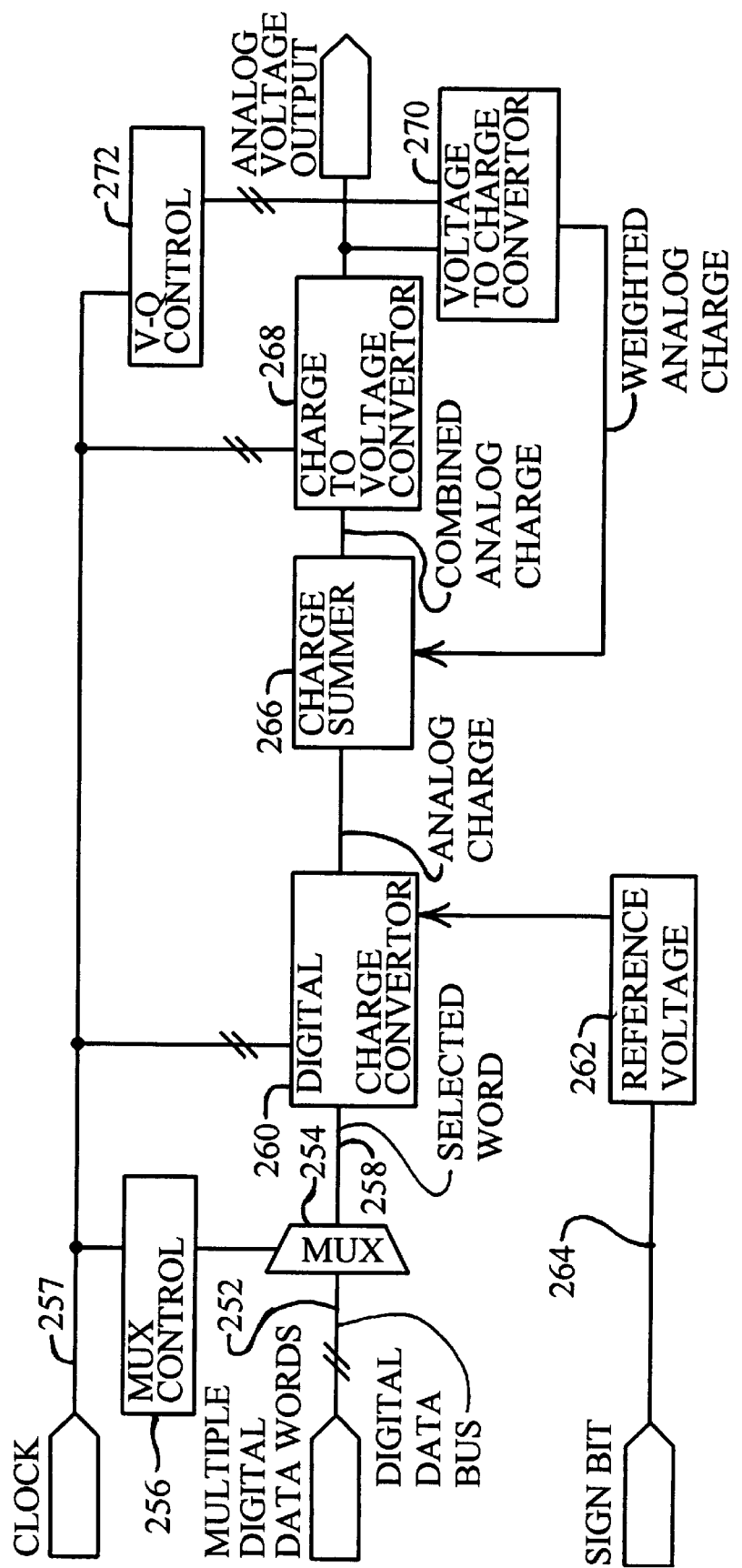
FIG. 1 is a block diagram of a specific embodiment of the invention, showing a D/A converter in which portions of the digital signals in a digital signal bus, are time multiplexed to sequentially convert the multiple portions into respective analog charges using a single D-Q, and then the charges are combined.

FIG. 1 shows a first embodiment of the D/A converter 250 of the invention, having digital data bus 252 for multiple data words (or portions) of the digital signals. The words may be 1 to 12 bits long (preferably 4 to 6 bits long), and may be different sizes. The digital signals may be divided into 2 to 6 words or portions.

The data bus is connected to a multiplexer 254. Multiplexer controller 256 communicates with clock signal line 257 and multiplexer 254 to control the selection of one of the portions or words of the digital bus, depending on the clock signal. First, an LSP or first portion of the digital signals is routed through the multiplexer, and transmitted through digital bus 258, to digital-to-charge converter (D-Q) 260. The D-Q also is connected to reference voltage source 262, in order to charge the conversion capacitors (not shown), and is synchronized and controlled by clock line 257, to time the internal operation of the D-Q. The D-Q converts the first word or LSP to a first analog charge (Q1).

The relative polarities of reference voltages of the reference voltage source depend on the value of a SIGN BIT in sign bit line 264 of the digital data bus. The D-Q outputs the Q1 through charge-summer (ΣQ) 266 to charge-to-voltage converter (Q-V) 268. Clock signal line 257 synchronizes and controls the Q-V. The Q-V outputs a voltage to voltage-to-charge converter (V-Q) 270, which is also connected to V-Q control 272, to control the internal operation of the V-Q.

Then the multiplexer admits the next most significant portion or second word of the digital signals, and the D-Q converts this second word to a second analog charge (Q2), which is output to the ΣQ 266. The V-Q also outputs a scaled analog charge to the ΣQ 266. The ΣQ adds the Q2 from the D-Q, with the scaled analog charge from the V-Q, to provide a combined analog charge (QC).

Each subsequent word of a digital signal is sequentially combined in this manner until the entire digital signal is represented by a final combined analog charge. Then the final combined charge is converted by the Q-V, to an analog output voltage, which is proportional to the value of the digital data on the digital data bus, and the output voltage is transmitted from the D/A converter.

For example, if the digital data of the bus includes only an LSP and a MSP, the multiplexer is first used to select the LSP of the digital signals. The D-Q converts the LSP of the digital signals to a least significant charge; the Q-V converts the least significant charge to a least significant voltage; and the V-Q converts the least significant voltage to a scaled charge for the LSP. Then the multiplexer is used to select the MSP of the digital signals, and the D-Q converts the MSP of the digital signals to a most significant analog charge. The most significant charge and the scaled charge for the LSP, are added by ΣQ 266 to form a combined charge, and the Q-V converts the combined charge to an analog output voltage.

Figure 2:
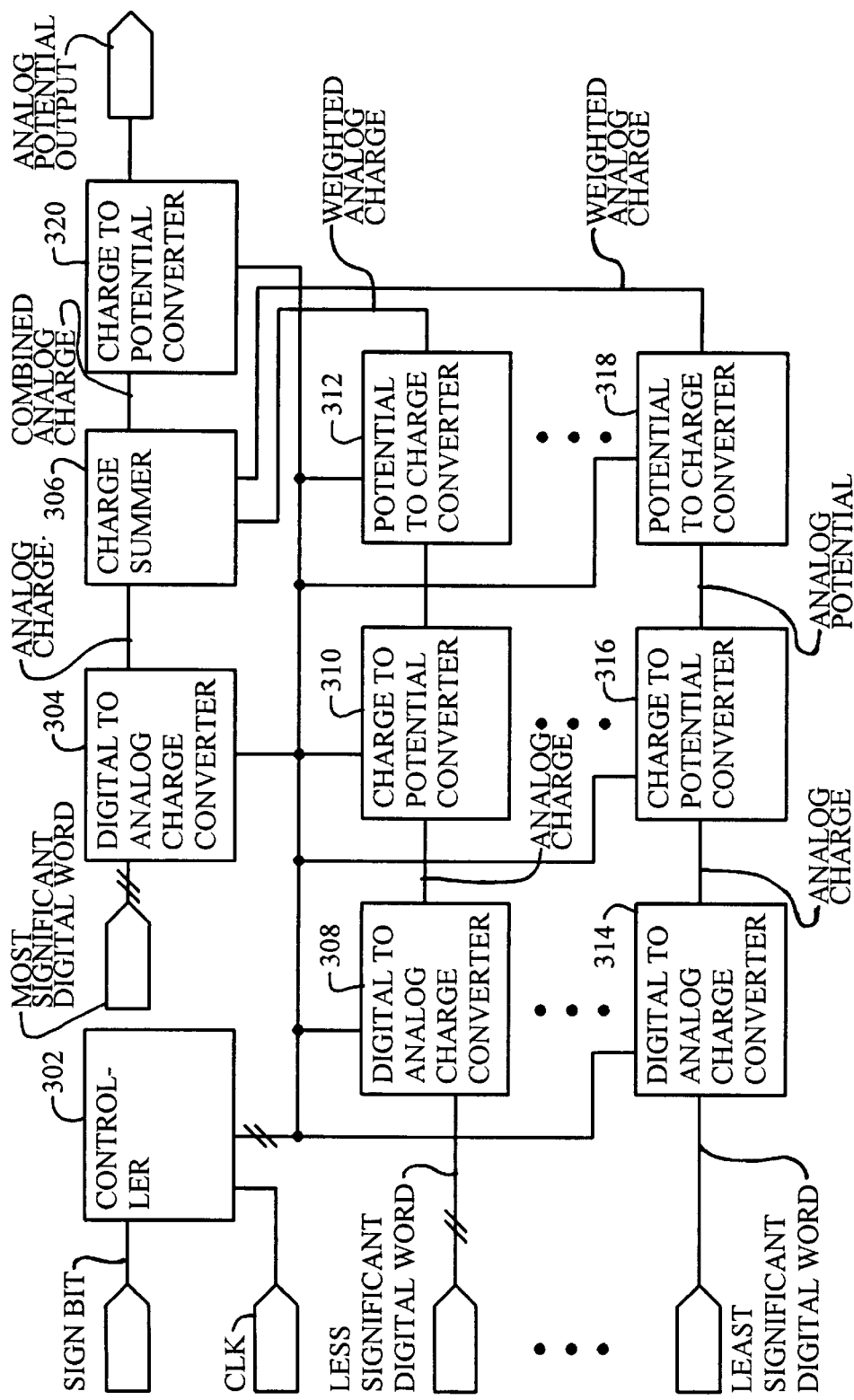
FIG. 2 is a block diagram of another specific embodiment of the invention, showing a D/A converter in which portions of multiple digital signals are converted to respective charges in parallel by different D-Qs, and then the charges are combined.

FIG. 2 illustrates a second embodiment of the D/A converter 300 of the invention. A controller 302 has as inputs the SIGN BIT signal and clock signal CLK, and generates control signals (clock signals) to regulate the D-Q's, Q-V's, and V-Q's of the system. A MSP of the digital signals are transmitted through a first digital data bus to D-Q 304, which converts them to a most significant charge, which is transmitted to ΣQ 306. The ΣQ may be a node or junction into which several charges are transmitted to combine the charges.

A less significant portion of the digital signals is transmitted through a second digital data bus to D-Q 308, which converts them to a less significant charge. The less significant charge is transmitted to Q-V 310, which converts the less significant charge to a less significant voltage. The less significant voltage is transmitted to V-Q 312, which converts the less significant voltage to a less significant scaled charge, which is transmitted to ΣQ 306. Thus, Q-V 310 and V-Q 312 together operate as a charge divider to convert the charge to a scaled charge.

An LSP of the digital signals is transmitted through a third digital data bus to D-Q 314. The D-Q converts the transmitted charges to a least significant charge, which is transmitted to Q-V 316, which converts the least significant charge to a least significant voltage. The least significant voltage is transmitted to V-Q 318, which converts the least significant voltage to a least significant scaled charge, which is transmitted to ΣQ.

ΣQ 306 adds the most significant charge to the less significant scaled charge and to the least significant scaled charge, in order to produce a combined charge. The combined charge is transmitted to Q-V 320, which converts the combined charge to an analog output voltage. Thus, in this embodiment, any number of portions of the signals in the data bus can be converted in parallel to analog charges, which are scaled, summed, and converted to a analog output voltage.

Figure 3:
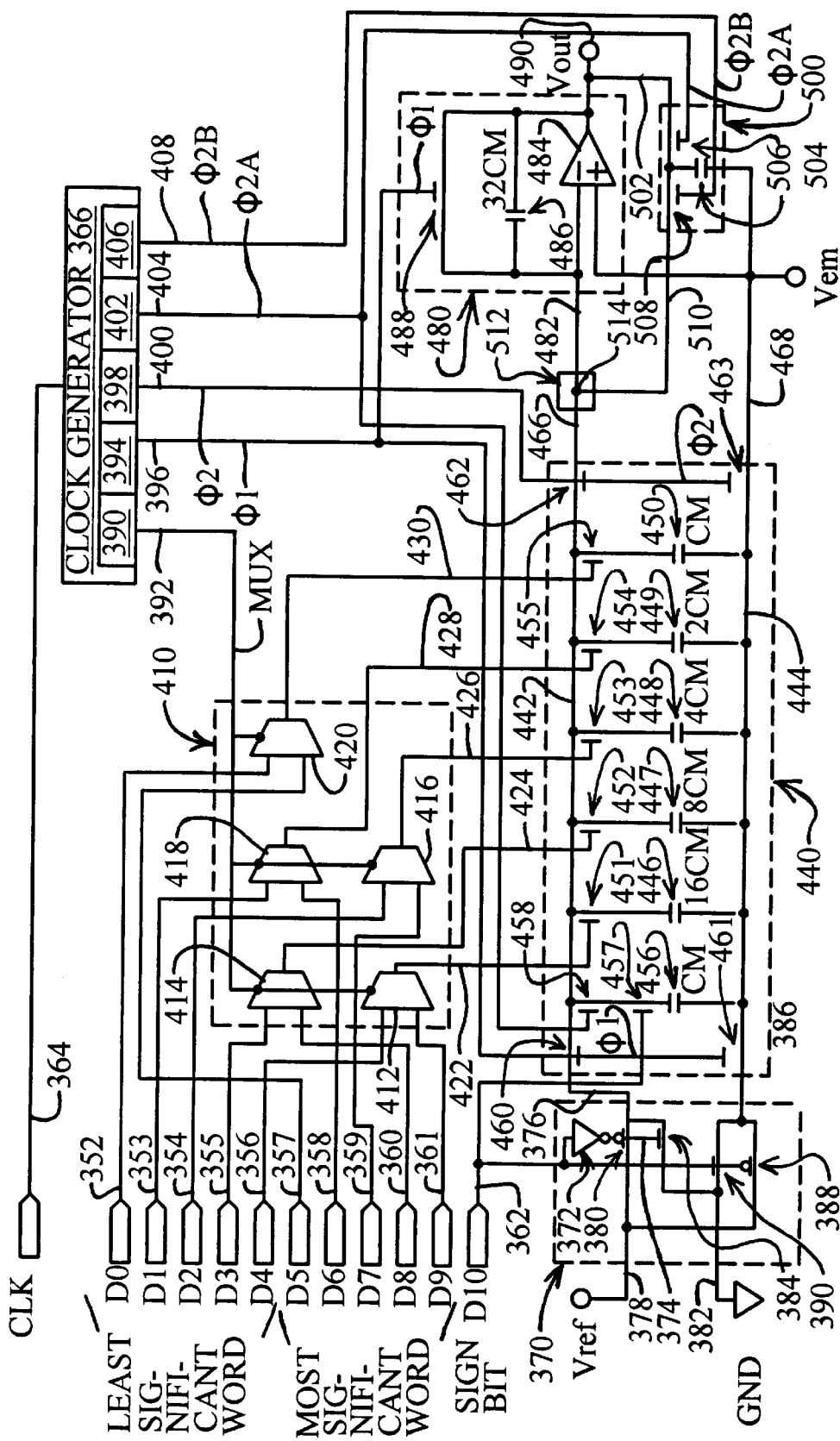
FIG. 3 is a schematic diagram of another specific embodiment similar to the embodiment of FIG. 1, with only two words of digital signals, and showing some selected details of the time-multiplexed D/A converter circuit.

FIG. 3 illustrates a specific embodiment of the D/A converter 350 of the invention, which is similar to the embodiment of FIG. 1, but which includes some selected additional details. The digital signal bus includes lines 352–356 for transmitting signals D0–D4 respectively of an LSP of digital data signals. The digital signal bus also includes lines 357–361 for transmitting signals D5–D9 respectively of an MSP of the digital data signals. The digital signal bus also includes a sign bit line 362 for transmitting a SIGN BIT signal D10. Also, a clock signal line 364 communicates to transmit the clock signal, to clock generator 366, for generating the clocking signals shown in the timing diagram of FIG. 4 described below.

Switching reference source (SRS) 370 is controlled by the sign bit line 362. The switching reference source includes inverter 372 to generate a complement sign bit signal in complement bit line 374. A first reference voltage (Vr1) 376 is connected to a source of high voltage 378 (Vref) through switch 380, and is connected to a source of low voltage 382 (ground) through switch 384. A second reference voltage Vr2 386 is connected to the source of high voltage through switch 388, and is connected to the source of low voltage through switch 390. The sign bit line controls switches 388 and 390, and the complement sign bit line controls switches 380 and 384.

When the SIGN BIT signal is high, the complement sign bit signal is low, switches 380 and 390 are closed, and switches 384 and 388 are open, so that Vr1 output 376 is set to Vref, and Vr2 output 386 is set to ground (low voltage). In this embodiment all the switches may be MOS transistors or any other elements capable of switching electronic signals. When the SIGN BIT signal is low, the complement sign bit signal is high, so that switches 380 and 390 are open, and switches 384 and 388 are closed. The Vr1 output 376 is set to ground, and a Vr2 output 386 is set to Vref.

Clock generator 366 receives the CLK signal through clock line 364 and provides control (or clocking) signals, derived from the CLK signal. The timing and relationships between the clocking (or control) signals are described below with reference to FIG. 4. The clock generator provides a clock signal Φ1 onto net 396 and a clock signal Φ2 onto net 400. The clock generator also provides a clock signal Φ2a onto net 404. Φ2a indicates when the LSP charges are being converted to a least significant voltage. The clock generator also provides clock Φ2b onto net 408. Φ2b indicates when the charges for the MSP of the digital signals are being redistributed, summed with a scaled charge for the LSP, and the resulting combined charge converted to an MSP of the analog charge.

Multiplexer circuit 410 includes 5 multiplexers 412, 414, 416, 418 and 420 which selectivey route signals from one of the digital signal lines to lines of a transfer bus.

In this example embodiment, lines 356 and 361 are inputs of multiplexer 412 which routes either signals D9 or D4 to an output line 422. Lines 355 and 360 are different inputs to multiplexer 414 that routes either signals D8 or D3 to line 424. Lines 354 and 359 input to multiplexer 416 that routes either signals D7 or D2 to line 426. Lines 353 and 358 are inputs of multiplexer 418 that routes either signals D6 or D1 to line 426. Lines 352 and 357 are inputs of multiplexer 420 that routes either signals D5 or D0 to line 430. When the MUX signal on net 392 is low, the multiplexer circuitry route the LSP (D0–D4) of the signals onto respective outputs. When the MUX signal is high, then the MSP (D5–D9) of the digital signals is routed onto the multiplexer outputs.

D-Q 440 includes a charge redistribution line 442, and a voltage distribution line 444. A plurality of conversion capacitors 446–450 each have one plate connected to the voltage distribution line and the other plate connected to the charge redistribution line through respective charge switches 451–455. Digital signal lines 422–430 control the respective switches. Capacitors 446–450 are binaurally weighted such that 450 is a unit-sized capacitor where unit size is dictated by: the signal-to-noise ratio of the converter; capacitor matching to provide the desired linearity; and minimum dimensions that can be reliably manufactured. Thus, capacitor 449 would have twice the value of capacitor 450 and be referred to as a 2-unit capacitor. Likewise, 448 would be a 4-unit capacitor, 447 would be an 8-unit capacitor, and finally 446 would be a 16-unit capacitor. The capacitors may include multiple smaller capacitors connected electrically in parallel; for example, capacitor 449 may consist of two capacitors each of unit-size and connected in parallel to provide a capacitance of 2 units.

A voltage of V, imposed across the plates of a conversion capacitor, when the corresponding charge switch is closed, could transfer a charge of Q=C*V, where Q is a charge in coulombs, C is the capacitance in farads, and V is a voltage across the capacitor. Otherwise, if the charge switch were off, no charge would be stored. For capacitor 450, Q=Cunit*Vref where Cunit is the capacitance of a unit sized capacitor. We shall refer to a value of Cunit times Vref as a unit charge (Qunit); thus, capacitor 449 would store 2 Qunits when a voltage of Vref is applied to its terminals.

A sign bit capacitor 456 is connected to the voltage distribution line, and also to the redistribution line through switches 457 and 458. Switch 457 is controlled by the sign bit net 362, and switch 458 is controlled by net 404 (signal Φ2a). Therefore, the sign bit capacitor is used when the SIGN BIT signal is high (indicating a negative digital value) and the LSP of the digital signals is being redistributed. This is necessary to properly implement a conversion from a 2's complement digital representation of a negative value to a corresponding amount of charge.

In order to charge the conversion capacitors, charging switch 460 turns on to connect charge redistribution line 442 with the first voltage output 376, and another charging switch 461 turns on to connect voltage distribution line 444 with the second voltage output 386. In order to redistribute the charge, the charging switches turn off; output switch 462 turns on to transmit the charge for the LSP to D-Q output 466; and output switch 463 turns on to connect voltage distribution line 444 to the common-mode voltage (Vcm) net 468.

The D-Q output 466 is connected to the input 482 of Q-V 480, to transmit the charge from the D-Q to the Q-V. The Q-V includes an operational amplifier 484 with capacitor 486 connected between the negative input and the output of the amplifier. The value of capacitor 448 is $C=2^N*Cunit$, where Cunit is the unit capacitance used for capacitor 450, and N is the number of bits in the LSP of the digital word. In this example there are 5 bits in the LSP, so the capacitance of capacitor 486 is $2^5*Cunit=32*Cunit$. A discharging switch 488 is also connected between the negative input and output. The discharge switch is controlled by the Φ1 signal.

V-Q 500 includes an input 502 connected to output 490 of the Q-V. The V-Q includes a sampling capacitor 504 connected through an input switch 506 with V-Q input 502. The V-Q also includes an output switch 508 for controlling the connection between the sampling capacitor and V-Q output, 510. The input switch is controlled by Φ2a in net 404, which closes switch 506 when the voltage for the LSP of the digital signals is being output from the Q-V. The output switch is controlled by Φ2b in net 408, so that V-Q can present an output signal to the ΣQ, when the MSP of the digital signals is being redistributed and converted to a most significant voltage.

Starting at the summing node 512, the path through the Q-V and back through the V-Q has a transfer function which relates the input charge to the Q-V to the output charge from the V-Q. This is the path that the information for the LSP takes to get back to the summing node 512 as a charge. It is advantageous to set the transfer function along this path so that the LSP information (charge) is properly scaled to combine with the MSP charge entering the summing node on a subsequent conversion cycle. To set the transfer function, the individual transfer functions of the V-Q and Q-V can be adjusted. We have already constrained the Q-V by choice of capacitor 486. A particularly attractive gain scaling would divide the charge entering the Q-V by $2^N$ (where N is the number of bits in the LSP) and place this $2^N$ scaled output charge on the summing node via the V-Q. It can be seen that setting the capacitor 504 to a unit capacitor in this implementation achieves exactly this result and properly scales the charge from the LSP to combine with the charge from the MSP to arrive at the desired result.

Summer 512 is a junction or node 514 to connect D-Q output 466 and V-Q output 510 to Q-V input 482.

Figure 4:
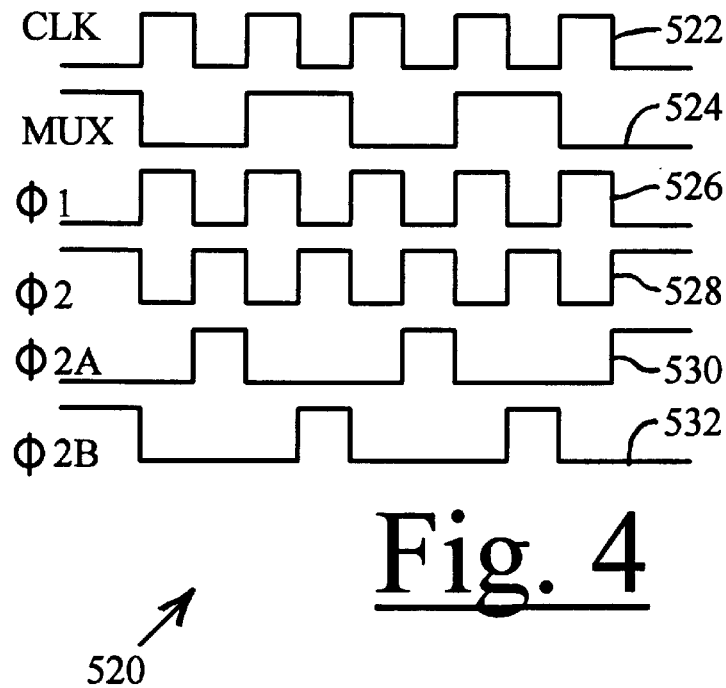
FIG. 4 is a timing diagram of the control signals of FIG. 3 including four-phase, non-overlapping clock signals.

FIG. 4 is a timing diagram 520, showing the control signals described in relation to FIG. 3 for the IC component of the invention. The CLK signal 522 is ideally a square wave, and the controller (clock generator 366 in FIG. 3) produces the other control signals from the CLK signal. MUX signal 524 controls the switching of the multiplexer circuitry (412–420 in FIG. 3). When the MUX signal is low, the less significant portion of the digital signals is routed to the D-Q. When the MUX signal is high, the MSP of the digital signals is routed to the D-Q. Φ1 signal 526 is the first phase of a 2-phase non-overlapping clock. When Φ1 is high, then charging control switches (460 and 461 in FIG. 3) are on, in order to charge the conversion capacitors with the reference voltages. When Φ1 is high, then the charging control switches (460 and 461 in FIG. 3) are on, and the reference voltages communicate with the charge distribution line and voltage distribution line, for recharging the conversion capacitors.

The Φ2 signal 528 is the second phase of the 2-phase non-overlapping clock, and controls connection between the Q-V and the charge and voltage distribution lines of the D-Q. When Φ2 is high, D-Q output switches 462–463 are on, and transmit the redistributed charge from the D-Q to the Q-V. When Φ2 is low, then the D-Q output switches 462–463 are off, and the D-Q are disconnected from the Q-V, and the conversion capacitors can be recharged as described above.

The Φ2a signal 530 is active on active phases of Φ2 when MUX is low. When Φ2a is active, the voltage output of the Q-V is the result of only the LSP conversion. Also, when Φ2a is active, V-Q input switch 506 is on, and the V-Q samples the voltage output of the Q-V.

The Φ2b signal 532 is active only on active phases of Φ2 when MUX is high. When Φ2b is high, V-Q outputs a scaled charge for the LSP of the digital signal input. The D-Q transmits the charge for the MSP of the digital signals, the D-Q and V-Q charges are summed, and the combined charge is converted to an output voltage (VO) by the Q-V.

Figure 5:
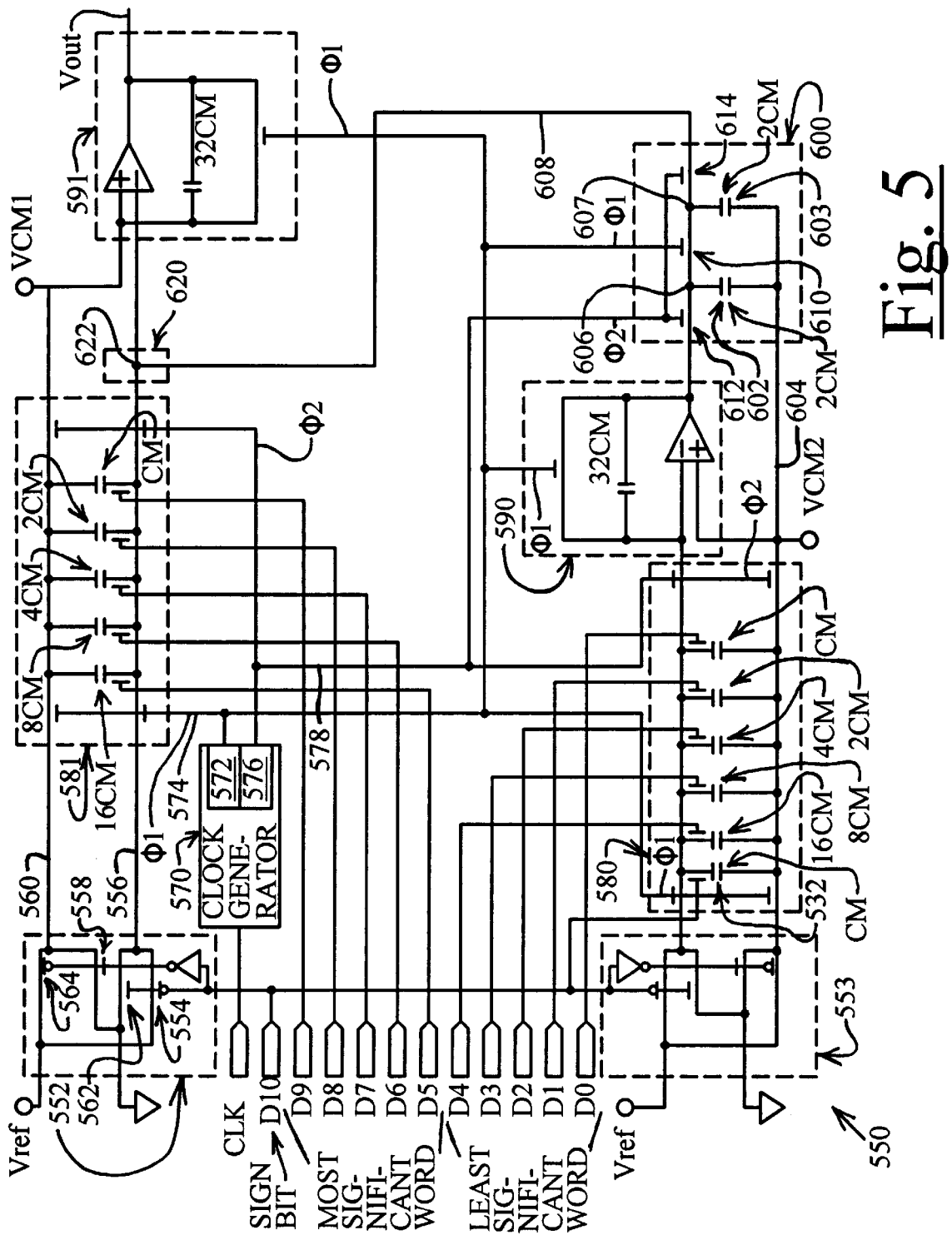
FIG. 5 is a schematic diagram of another specific embodiment of the invention, similar to the embodiment of FIG. 2, with only two digital signals, showing some selected details of a parallel operation D/A converter circuit.

FIG. 5 illustrates another specific embodiment of the D/A converter 550 of the invention. This is similar to the embodiment of FIG. 2, but with only two portions (words) of digital signals in order to avoid unnecessary complexity in the description. As described above for FIG. 3, the digital signals include an LSP D0–D4 and an MSP D5–D9 and a SIGN BIT signal D10. Also as in FIG. 3, the D/A converter is bipolar and allows the digital signals to have either a positive value or negative value (which is transmitted in 2's complement form). The SIGN BIT signal for negative numbers is high.

For switching reference source (SRS) 552, when the SIGN BIT signal is low, the digital signals represent a positive number. Then switch 554 connects Vref to first reference output 556, and switch 558 connects GND to second reference output 560. When the value represented by the digital signals is negative, the SIGN BIT signal is high. Then switch 562 connects the low reference voltage source (GND) to first reference output 556, and switch 564 connects the high reference voltage source Vref to the second reference output 560. Switching reference source 553 operates in a similar manner to switching reference source 552.

Clock generator 570 includes a two-phase, non-overlapping clock generator circuit with portion 572 to provide signal Φ1 on net 574 and portion 576 to provide signal Φ2 on net 578. Signals Φ1 and Φ2 are identical to the Φ1 and Φ2 described in reference to FIG. 4 above.

D-Q 580 receives the LSP of the digital signals, and D-Q 581 receives the MSP of the digital signals. The apparatus and operation of D-Q 580 is the same as D-Q 440 in FIG. 3 described above, except there is no connection for a Φ2a clock signal in D-Q 580. Thus, the charge of the sign bit capacitor 582 is always added when the SIGN BIT signal is high (value is negative). The apparatus and operation of D-Q 581 is also the same as for D-Q 440, except there is no sign bit capacitor, no connection to the sign bit net, and no connection to the Φ2a net. Also, the apparatus and operation of Q-V 590 and Q-V 591, may be identical to the operation of Q-V 450 in FIG. 3, as described above.

The apparatus and operation of V-Q 600 is significantly different than that of V-Q 500 in FIG. 3. V-Q 600 includes two dividing capacitors 602 and 603, connected between common mode net 604 and nodes 606 and 607 respectively of line 608. Switch 610 is connected 608 between nodes 606 and 607. V-Q input switch 612 is connected in line 608 between Q-V 590 and node 606. The V-Q output switch 614 is connected in line 608 between node 607 and ΣQ 620. When Φ1 is high, Φ2 is low, the charges in the sampling capacitors are equalized. When Φ2 is high, Φ1 is low, and the voltage output from Q-V 590 charges capacitor 602, and a portion of the charge in capacitor 603 is transferred to ΣQ 620. The transferred charge is proportional to the voltage being transmitted in line 608 to ΣQ 620. The capacitances of the dividing capacitors are again chosen so that the charge delivered from V-Q 600 is equal to the charge output from D-Q 580 divided by N where N is the number of bits in the LSP.

ΣQ 620 is identical to ΣQ 512 of FIG. 3. ΣQ 620 consists of a node 622 to which the charge output from D-Q 581 and scaled charge output from V-Q 600 are transmitted. The node adds the charges and the total charge is transmitted to Q-V 591.

Since the operation of divider 600 requires a clock cycle, but the scaled charge output from divider 600 must arrive at the same time that the output from D-Q 581 arrives at ΣQ 620, then a delay of one clock cycle has to be provided for the output from D-Q. Either an input register for the digital input may be provided before D-Q 581, or an analog delay circuit may be provided between D-Q 581 and ΣQ 620.

Figure 6:
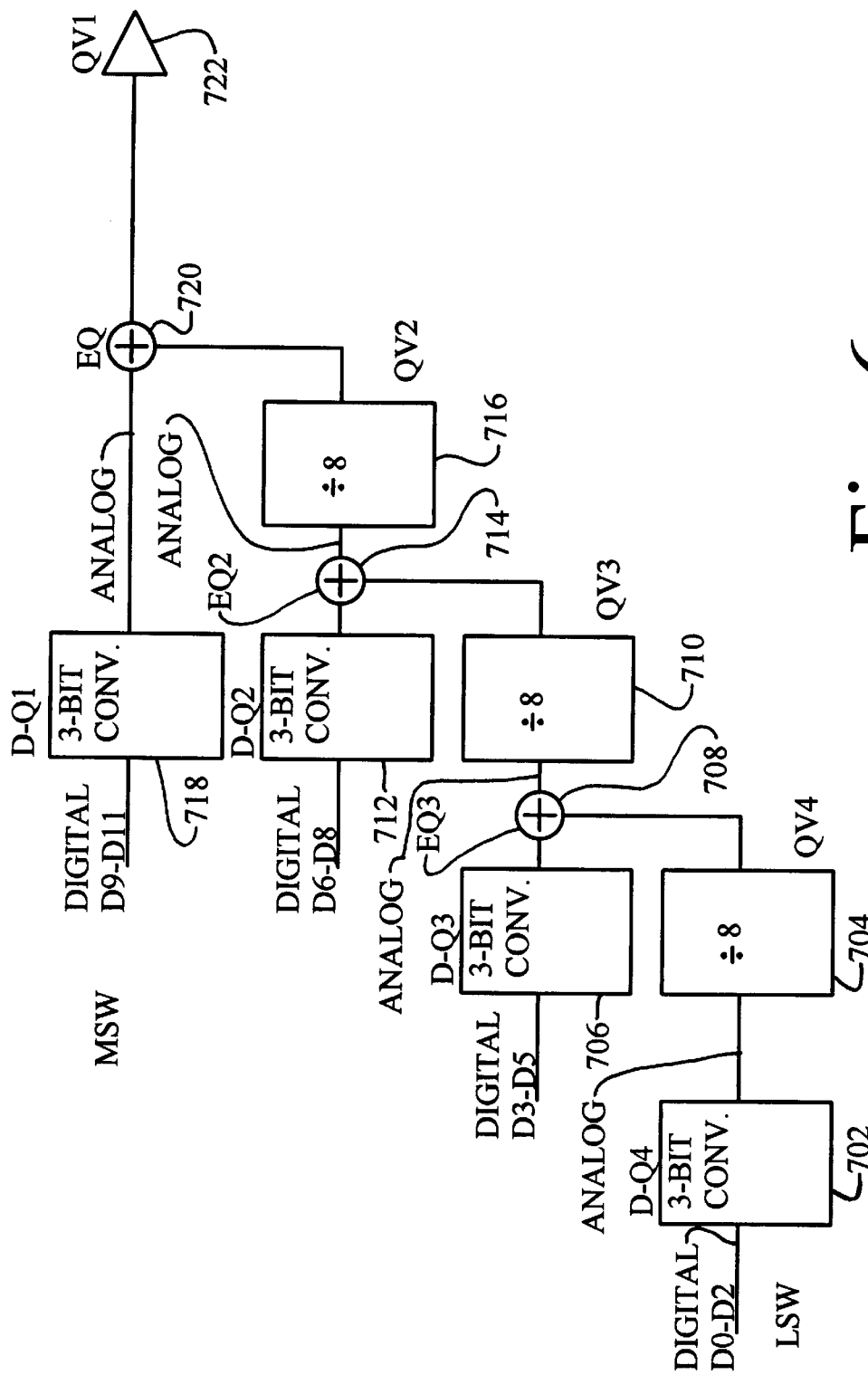
FIG. 6 is block diagram of another specific example embodiment of the invention, similar to the embodiment of FIG. 2, in which the results of multiple portions of the digital signals are added in a cascade fashion.

FIG. 6 shows another example embodiment of the D/A converter 700 of the invention, similar to the embodiment of FIG. 2, but with multiple cascaded converter sections. Preferably there are 2 to 6 sections. In the first clock cycle, the LSP of digital signals (D0, D1, D2) is converted by D-Q4 702 to a first charge. In the second clock cycle, the first charge is converted by divider 704 to a first scaled charge, and simultaneously, a second word of digital signals (D3, D4, D5) is converted by D-Q3 706 into a second charge, then the first scaled charge and second charge are added by charge summer 708 to form a first combined charge. In the third clock cycle the first combined charge is converted by divider 710 to a second scaled charge, and simultaneously another word of digital signals (D6, D7, D8) is converted by D-Q2 712 into a third charge, then the second scaled charge and the third charge are combined by charge summer 714 to form a second combined charge. In the fourth clock cycle the second combined charge is converted by divider 716 to a third scaled charge, and simultaneously a most significant word of digital signals (D9, D10, D11) is converted by D-Q1 718 into a fourth charge, then the third scaled charge and fourth charge are combined by charge summer 720, to form a third combined charge. The third combined charge is converted by operational amplifier 722 to an output voltage.

The method here can be used to pipeline the conversion such that the converter output is a valid analog output every clock cycle.

Figure 7:
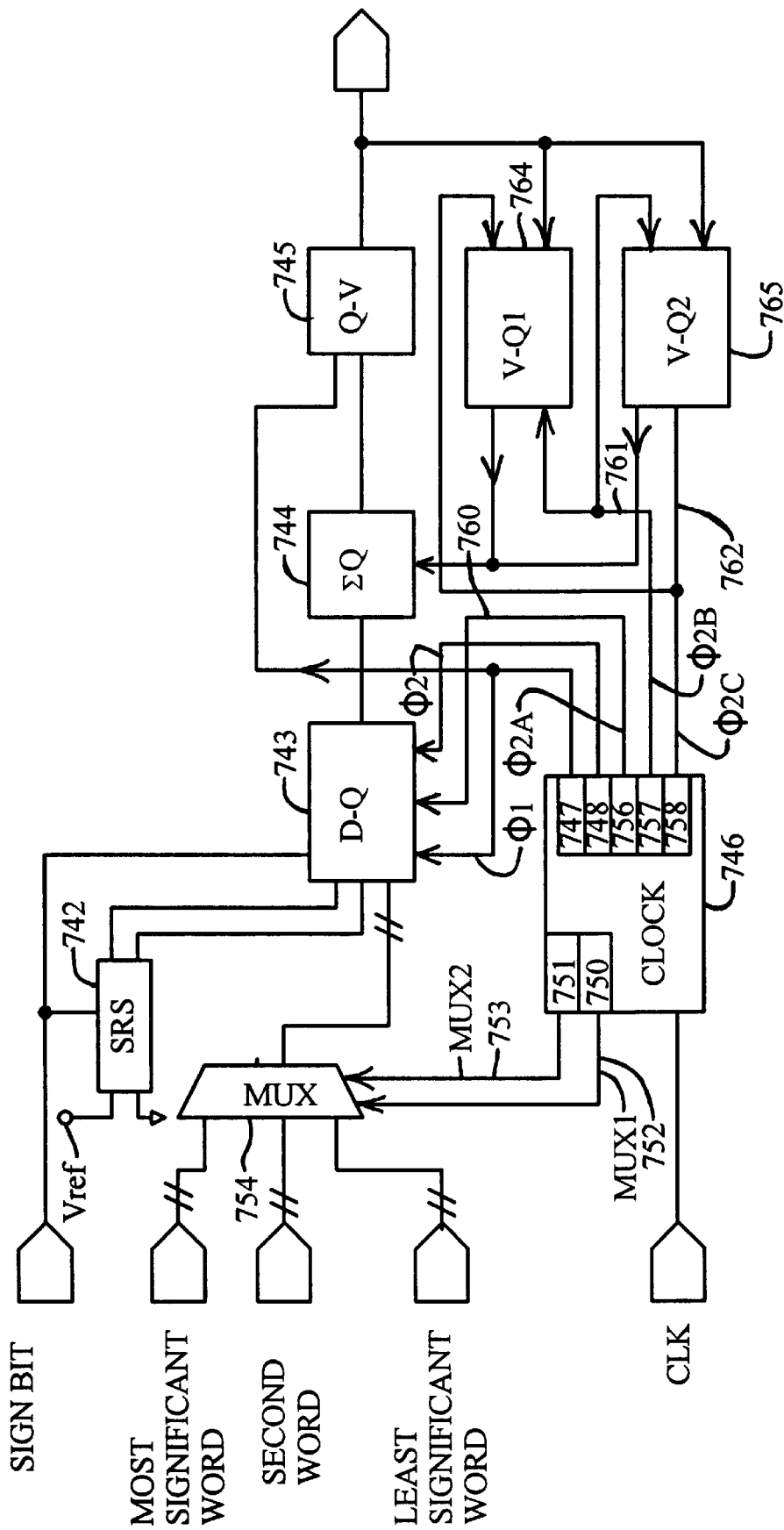
FIG. 7 is block diagram of another specific example embodiment of the invention, showing a D/A converter which uses time-multiplexed sequential conversion for three portions of multiple digital signals.

FIG. 7 shows another example embodiment 740 of the invention in which the embodiment of FIG. 3 has been modified for digital signals which are combined as three portions. Switching reference source (SRS) 742, D-Q 743, ΣQ 744, and Q-V 745 may be identical to corresponding circuitry described in detail above, in relation to FIG. 3. Controller 746 includes circuitry 747 and 748 for providing two-phase non-overlapping clock signals Φ1 and Φ2, to control the operation of D-Q 743 and Q-V 745, in a manner similar to the operation of circuitry 394 and 398 of FIG. 3 described above.

Multiplexer control circuitry 750 and 751 of controller 746 produces MUX1 signals on net 752, and MUX2 signals on net 753, to control 3-way multiplexer MUX 754. Circuit 756 produces signal 760 which adds a 1 to the least significant word, when the SIGN BIT signal is 1 (negative value). V-Q control circuitry 757 and 758 produce clock signals Φ2b and Φ2c respectively, and the signals are transmitted onto nets 761 and 762 respectively, to control V-Q1 764 and V-Q2 765 respectively.

Figure 8:
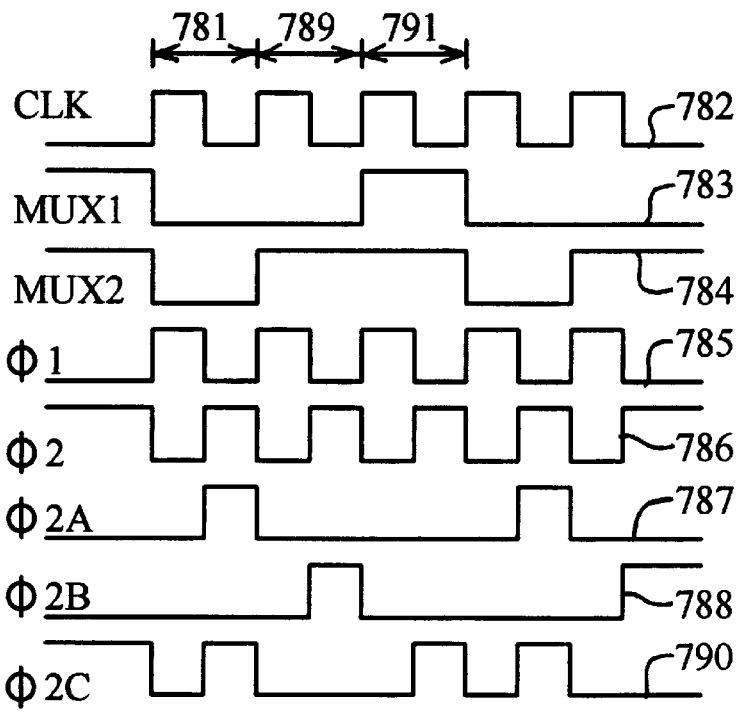
FIG. 8 is a timing diagram of some selected control signals of FIG. 7.

The embodiment of FIGS. 7 and 8 can be modified (not shown) to allow the digital signals to be divided into four or more portions by adding another input into MUX1, modifying multiplexer control circuitry 750 and 751, and modifying circuits 756–758 for the additional word cycle.

FIG. 8 is a timing diagram for the operation of the A/D converter of FIG. 7. In the first half of the first cycle 781 of CLK signal 782, MUX1 signal 783 and MUX2 signal 784 are low to route the LSP of the digital signals to D-Q 748. Signal Φ1 785 is high to connect switching reference source 742 with the charge redistribution line and voltage distribution line (see FIG. 3), to charge the conversion capacitors. Signal Φ2 is low to isolate the Q-V from the reference voltages.

In the second half of the first cycle, Φ1 is low and the reference voltages are disconnected from the charge line and common-mode net. Φ2 is high and a first charge for the LSP is transmitted from D-Q 743 to Q-V 745, to convert the first charge to a first voltage. Φ2a 787 is high and a sign bit charge may be added if the SIGN BIT signal is high (value is negative). Φ2b 788 is low, and the the sampling capacitor of V-Q1 is isolated from ΣQ 744, and signal Φ2c 790 is high, to charge the sampling capacitor of V-Q1.

In the first half of the second cycle 789 of the CLK signal, MUX1 is low and MUX2 is high, and the second part of the digital signals is routed to D-Q 748. Φ1 is high and switching reference source 742 is connected to the charge redistribution line and voltage distribution line, to charge the conversion capacitors (see FIG. 3). Φ2 is low and Q-V 745 is disconnected from the reference voltages.

In the second half of the second cycle, Φ1 is low and the reference voltages are disconnected from Q-V. Φ2 is high and a second charge is transmitted from D-Q 743 to ΣQ 744. Φ2b is high and a first scaled charge is transmitted from V-Q1 to ΣQ 744 and the voltage output from the Q-V is admitted to charge a sampling capacitor of V-Q2. Φ2c is low, and the sampling capacitor of V-Q1 is disconnected from the voltage output from the Q-V, and the sampling capacitor of V-Q2 is disconnected from ΣQ 744. The second charge and first scaled charge are added by ΣQ 744 and transmitted to the Q-V, to convert the combined charge to a second voltage.

In the first half of the third cycle 789, of the CLK signal 782, MUX1 is high and MUX2 is high, the MSP of the digital signals is input to D-Q 748. Φ1 is high and switching reference source 742 is connected with the charge line and common-mode line in order to charge the conversion capacitors (see FIG. 3). Φ2 is low and Q-V 745 is disconnected from the reference voltages.

In the second half of the third cycle, Φ1 is low and the reference voltages are disconnected from the charge line and common-mode net. Φ2 is high and a third charge is transmitted from D-Q 743 to ΣQ 744. Φ2b is low and the sampling capacitor of V-Q2 is disconnected from the voltage output from the Q-V, and ΣQ is disconnected from the sampling capacitor of V-Q1. Φ2c is high and a second scaled charge from the sampling capacitor of V-Q2 is transferred to ΣQ 744. The third charge and second scaled charge are added by ΣQ 744 and transmitted to the Q-V, to convert the combined charge to a third voltage which is output from the D/A converter.

FIGS. 9a–9c are parts of a flow diagram of a specific embodiment of the process of the invention for providing an IC. These devices are preferably produced by standard IC fabrication procedures that are well known in the art. In steps 802 and 804, a multitude of digital signal buses each including a multitude of signal lines, are provided. In step 806, at least one multiplexer is provided, and in step 808, one line of each of two or more digital signal buses communicate with the inputs of each of a plurality of multiplexers. The output of each multiplexer is connected to a respective line of another one of the digital signal buses. Steps 806–808 are only required for time-multiplexed embodiments of the invention.

In step 810, at least one D-Q is provided, and in step 812, the signal lines of one of the buses communicate with digital inputs of one of the D-Qs. In step 814, at least one switching reference source is provided. Alternately, a non-switching reference system may be provided, and the digital signals restricted to positive values. In step 816, one of the reference sources is connected to reference inputs of one of the D-Qs. In step 818, at least one analog charge-to-voltage converter is provided, and in step 820, an output of one of the D-Qs is connected to the input of one of the Q-Vs.

In step 822, at least one V-Q converter is provided, and in step 824, an output of one of the Q-Vs is connected to the input of one of the V-Qs. In step 826, at least one ΣQ is provided, for adding multiple charges, and in step 828, an output of one of the V-Qs and an output of one of the D-Qs communicate with respective inputs of one of the ΣQs. In step 830, the output of one of such ΣQs is connected to the input of one of the Q-Vs. In step 832, an output voltage signal line is provided. In step 834, a controller is provided, and in step 836, the controller is connected to at least one of the D-Qs, at least one of the Q-Vs, and at least one of the V-Qs. In step 838, the controller is connected to at least one of the multi-plexers. Again, step 838 is optional depending on whether time-multiplexing is used.

FIGS. 10a–10c are parts of a flow diagram of an embodiment 850 of the method of the invention for operating a D/A converter component. In step 852, multiple portions of a multitude of digital data signals are transmitted through respective digital signal buses. The portions include multiple simultaneous digital signals, and the digital signal buses include a respective line for each respective simultaneous digital signal. In step 854, the plurality of portions of the signals are transmitted to the inputs of multiple multiplexer circuits. They include a multiplexer circuit for each simultaneous signal of the portions. In step 856, a first one of the plurality of portions is selected for output from the multiplexers, and in step 858, the signals of the first portion are routed through the multiplexers to one of the digital signal buses. Steps 856–858 are optional depending on whether the embodiment of the apparatus of the invention uses time-multiplexing.

In step 860, the first portion of multiple simultaneous digital signals is transmitted through respective lines of the digital signal bus to the input of one of the D-Qs, and in step 862, the first portion of digital signals is converted into a Q1. In step 864, Q1 is transmitted to an input of one of the Q-Vs, and in step 866, Q1 is converted to a first analog voltage (V1). In step 868, the V1 is transmitted to an input of one of the V-Qs, and in step 870, the V1 is converted to a Q2.

In step 872, a second one of the plurality of portions of the digital signals is selected for output from the multiplexers, and in step 874, the signals of the second portion of the digital signals is routed through the multiplexers onto one of the digital signal buses. Again step 872–874 are optional depending on whether time-multiplexing is used in a specific embodiment of the apparatus of the invention. If time-multiplexing is not used, the following steps 876–878 may be done in parallel with the above steps 860–868. In step 876, a second portion of simultaneous digital signals is transmitted through respective lines of one of the digital signal buses to the input of one of the D-Qs, and in step 878, the second portion of the digital signals is converted into a Q3.

In step 880, Q2 and Q3 are transmitted to a ΣQ, and in step 882, the Q2 and Q3 are added by ΣQ to form a combined analog charge (QC). In step 884, QC is transmitted to one of Q-Vs, and in step 886, the combined charge is converted to an output voltage (VO). In step 888, the VO is transmitted from an output of the Q-V through a voltage output line.

The invention has been described with reference to specific embodiments including the best mode for carrying out the invention, and with sufficient detail that anyone skilled in the art can use the invention. Those skilled in the art may modify these embodiments or provide other embodiments within the spirit of the invention, and thus, the description does not limit the present invention to the disclosed embodiments. The invention is limited only by the following appended claims.

We claim:

1. An integrated circuit, comprising:
    a digital bus to conduct parallel digital signals including a less significant portion of the signals and a more significant portion of the signals;
    digital-to-charge converter connected to the digital bus and including means to convert the less significant portion of the signals to a first charge and to convert the more significant portion of the signals to a second charge;
    a charge-to-voltage converter connected to the digital-to-charge converter and including means to convert the first charge to an intermediate analog voltage;
    a voltage-to-charge converter connected to the charge-to-voltage converter, to convert the intermediate analog voltage to a third charge;
    a charge-summer connected to the digital-to-charge converter and the voltage-to-charge converter, to combine the second charge with the third charge to produce a combined charge; and
    in which the charge-to-voltage converter is connected to the charge-summer and further includes means to convert the combined charge to an analog output voltage.

2. The circuit of claim 1, comprising:
    a digital bus having multiple lines for corresponding parallel digital signals and including first lines for a less significant portion of the signals and second lines for a more significant portion of the signals;
    first control means for generating a multiplexer control signal to select alternatingly the more significant portion of the signals or the less significant portion of the signals;
    a transfer bus having at least as many lines for parallel digital signals as the first lines and as many lines as the second lines of the digital bus;
    a multiplexer controlled by the first control means and connected to the digital bus and transfer bus to select either the less significant portion and more significant portion of the signals for output onto the transfer bus depending on the multiplexer control signal;
    second control means for generating first conversion control signals to regulate the conversion of digital signals to a charge;
    a first charge line for carrying a charge;
    a digital-to-charge converter controlled by the second control means and connected to the transfer bus, and the charge line for converting the digital signals on the transfer bus into a first charge signal transmitted onto the charge line depending on the first conversion signal;
    third control means for generating second conversion control signals to regulate the conversion of charge to voltage;
    an analog voltage line;
    a charge-to-voltage converter controlled by the third control means and connected to the first charge line and voltage line to convert the charge of the first charge line into an analog voltage which is output onto the voltage line depending on the second conversion signal;
    fourth control means for generating third conversion control signals to regulate the conversion of the voltage resulting from the less significant portion of digital signals into a charge for the less significant portion of the signals;
    a second charge line for carrying a charge;
    a voltage-to-charge converter connected to the voltage line and second charge line to convert an analog voltage for the less significant portion of the signals to a second charge for the less significant portion of the signals output onto the second charge line depending on the third conversion signal; and summing means connected to the first and second charge lines for combining a third charge resulting from converting the more significant portion of signals with the second charge produced from the less significant portion of signals and outputting the combined charge; and in which the charge-to-voltage converter also is connected to the summing means to convert the combined charge into an analog voltage which is output onto the voltage line depending on the second conversion signal.

3. The circuit of claim 2 in which:

the second, third, and fourth control means consist of a clocking generator circuit including a multi-phase, non-overlapping clock generator and the first, second, and third control signal means consist of multi-phase non-overlapping clock signals;

the multiplexer includes from 3 to 8 multiplexing circuits, each connected to a respective signal line of each portion of multiple parallel lines of the digital bus;

the digital-to-charge converter includes:

a source of a first reference voltage;

a charge distribution line;

a switch to connect/disconnect the charge distribution line with the source of a first reference voltage;

a source of a second reference voltage;

a voltage distribution line;

a switch to connect/disconnect the voltage distribution line from the source of a second reference voltage;

a plurality of binaurally weighted conversion capacitors including one of a minimum size to provide resolution with respect to noise or manufacturability, with a first plate connected to the voltage distribution line;

a switch in series with each respective conversion capacitor, connected between a second plate of each respective capacitor and the charge distribution line, and each switch controlled by a different line of the transfer bus to control the setting of the respective switch;

input switches to connect the first reference voltage to the voltage distribution line and the second reference voltage to the charge distribution line to charge the conversion capacitors and to disconnect the sources of voltage from the digital-to-charge converter when charge is output to the charge-to-voltage converter; and output switches to connect the charge distribution line and voltage distribution line to respective inputs of the charge-to-voltage converter and a to disconnect the charge and voltage distribution lines from the charge-to-voltage converter when the conversion capacitors are being recharged;

the sources of first and second reference voltage include respective voltage-multiplexers connected to a source of high reference voltage, a source of low reference voltage, and a sign bit line with a sign signal to control switching between: a first state in which the source of first reference voltage is connected to the source of high reference voltage and the source of second reference voltage is connected to a source of low reference voltage;

and a second state in which the source of first reference voltage is connected to the source of low reference voltage and the source of second reference voltage is connected to the source of high reference voltage; and the digital-to-charge converter further includes a capacitor of the minimum size, with one plate connected to the voltage distribution line and the other plate connected through two switches to the charge distribution line and with a control input of one switch connected to the sign bit and the control input of the other switch connected to the third control means;

the charge-to-voltage converter includes:

an operational amplifier with a negative input terminal, a positive input terminal, and an output terminal;

an integration capacitor between the negative input terminal and output terminal of the amplifier; and a switch between the negative input terminal and output terminal of the amplifier, electrically in parallel with the integration capacitor;

the voltage-to-charge converter includes:

a sampling capacitor;

an input switch for connecting the capacitor to the analog voltage line to charge the sampling capacitor when the charge-to-voltage converter is outputting an analog voltage for the less significant word, and for isolating the sampling capacitor from the output voltage when the conversion capacitors are being recharged; and an output switch for connecting the sampling capacitor to the input of the charge-to-voltage converter when controlling the digital-to-charge converter to output a charge for the more significant portion of the signals, and for isolating the sampling capacitor when controlling the digital-to-charge converter to recharge the conversion capacitors; and the summing means is a junction between the output of the voltage-to-charge converter and the output of the digital-to-charge converter.

4. The circuit of claim 1, comprising:

a first bus having multiple lines for corresponding parallel digital signals for a less significant portion of the signals;

a second bus having multiple lines for corresponding parallel digital signals for a more significant portion of the signals;

a first digital-to-charge converter connected to the first bus to convert the signals of the less significant portion of the digital signals to a first charge;

a first charge-to-voltage converter connected to the first digital-to-charge converter to convert the first charge into a first analog voltage;

a voltage-to-charge converter to convert the first analog voltage to a second charge;

a second digital-to-charge converter connected to the second bus to convert the signals of the more significant portion of the digital signals to a third charge;

summing means connected with the voltage-to-charge converter and the second digital-to-charge converter, for combining the second charge with the third charge to produce a combined charge; and a second charge-to-voltage converter connected to the summing means to convert the combined charge into an output analog voltage.

5. A process for operating a circuit, comprising:

converting parallel digital signals of a less significant portion of the signals to a first charge;

converting the first charge to a first analog voltage;

converting the first analog voltage to a second charge;

converting the parallel digital signals of a more significant portion of the signals to a third charge;

combining the second charge with the third charge to form a combined charge;

converting the combined charge to a second analog voltage; and transmitting the second analog voltage.

6. The process of claim 5 in which:

the step of converting the less significant portion of the digital signals to a first charge includes the steps of:
charging a set of binaurally weighted capacitors to provide respective binaurally weighted charges;
controlling the setting of a respective switch for each capacitor depending on the signals of the less significant portion; and
redistributing the charges of the capacitors in a charge output line, depending on the setting of the switches;

the process further comprises the steps of:
switching a reference voltage for charging the capacitors depending on the value of a sign bit signal;
setting switches to select the less significant portion of the digital signals prior to the step of converting the less significant portion of the signals to the first charge and then resetting switches to select the more significant portion of the signals prior to converting the more significant portion of the signals to the third charge; and
converting parallel signals of a less significant portion of the digital signals to a first charge.

7. A process for producing an integrated circuit, comprising the steps of:

providing a bus for digital signals;

providing a digital-to-charge converter including means to convert a less significant portion of the signals to a first charge and to convert a more significant portion of the signals to a second charge;

providing a charge-to-voltage converter including means to convert the first charge to an intermediate analog voltage and to convert a combined charge to an analog output voltage;

providing a voltage-to-charge converter including means to convert the intermediate analog voltage to a third charge; and providing a charge-summer including means to combine the first charge with the third charge to produce the combined charge.

8. An integrated circuit that outputs an analog signal based on an inputted digital signal having n bits, said circuit comprising:

a multiplexor device for receiving said n bits and sequentially outputting a first subset of said n bits, and then outputting a second subset of said n bits;

a digital to analog converter that, in sequence, converts said first subset of said n bits from said multiplexor into a first analog signal, and then converts said second subset of said n bits from said multiplexor into a second analog signal;

a scaling mechanism that scales said first analog signal; and a summing mechanism that sums said scaled first analog signal and said second analog signal.

9. The integrated circuit of claim 8 wherein said first subset of said n bits is a least significant portion of the digital signal.

10. The integrated circuit of claim 9 wherein said first subset of said n bits is a most significant portion of the digital signal.

11. The integrated circuit of claim 10 wherein said scaling mechanism divides said least significant portion of the digital signal by a scaling factor.

12. The integrated circuit of claim 8 wherein said digital to analog converter comprises:

a digital to charge converter; and a charge to voltage converter.

13. The integrated circuit of claim 12 wherein said summing mechanism comprises:

a voltage to charge converter, said voltage to charge converter being coupled to an output of said charge to voltage converter; and a charge summer coupled to an output of said voltage to charge converter, said charge summer being coupled between said digital to charge converter and said charge to voltage converter.

14. The integrated circuit of claim 1 wherein said digital to charge converter includes n/2 capacitors.

15. The integrated circuit of claim 1 wherein both said first and second subsets of n bits is comprised of n/2 bits.

16. The integrated circuit of claim 1 wherein said digital to analog converter is an n/2 bit digital to analog converter.

* * * * *